US008829667B2

(12) United States Patent
Park et al.

(10) Patent No.: US 8,829,667 B2
(45) Date of Patent: Sep. 9, 2014

(54) ELECTRONIC DEVICES INCLUDING EMI SHIELD STRUCTURES FOR SEMICONDUCTOR PACKAGES AND METHODS OF FABRICATING THE SAME

(71) Applicant: Samsung Electronics Co., Ltd., Suwon-si (KR)

(72) Inventors: Young-Woo Park, Hwaseong-si (KR); Wang-Ju Lee, Cheonan-si (KR); In-Sang Song, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/968,731

(22) Filed: Aug. 16, 2013

(65) Prior Publication Data

US 2014/0048913 A1     Feb. 20, 2014

(30) Foreign Application Priority Data

Aug. 17, 2012     (KR) .................... 10-2012-0089892

(51) Int. Cl.
*H01L 23/552*     (2006.01)
*H01L 23/31*     (2006.01)

(52) U.S. Cl.
CPC ..... *H01L 23/552* (2013.01); *H01L 2224/48145* (2013.01); *H01L 2224/73265* (2013.01); *H01L 2225/06506* (2013.01); *H01L 2225/0651* (2013.01); *H01L 2224/32145* (2013.01); *H01L 2224/32225* (2013.01); *H01L 2225/06568* (2013.01); *H01L 2224/48227* (2013.01); *H01L 23/3128* (2013.01); *H01L 2225/06537* (2013.01); *H01L 2924/15311* (2013.01)
USPC ..... 257/692; 257/659; 257/710; 257/E23.114; 257/E23.193

(58) Field of Classification Search
CPC .................................................. H01L 23/552
USPC ......... 257/659, 660, 678, 690, 691, 692, 698, 257/699, 708, 709, 710, E23.002, E23.114, 257/E23.124, E23.191, E23.193
See application file for complete search history.

(56) References Cited

U.S. PATENT DOCUMENTS

| 5,838,551 | A | 11/1998 | Chan | |
|---|---|---|---|---|
| 7,126,218 | B1 * | 10/2006 | Darveaux et al. | 257/706 |
| 7,488,903 | B2 * | 2/2009 | Kawagishi et al. | 174/385 |
| 7,928,538 | B2 * | 4/2011 | Salzman | 257/659 |
| 8,432,007 | B2 * | 4/2013 | Leidl et al. | 257/416 |
| 2003/0025180 | A1 | 2/2003 | Alcoe et al. | |
| 2003/0194832 | A1 * | 10/2003 | Lopata et al. | 438/108 |
| 2004/0065963 | A1 * | 4/2004 | Karnezos | 257/777 |

(Continued)

FOREIGN PATENT DOCUMENTS

| JP | 2001-160605 | 6/2001 |
|---|---|---|
| KR | 1020000045083 | 7/2000 |

(Continued)

*Primary Examiner* — Eduardo A Rodela
(74) *Attorney, Agent, or Firm* — Myers Bigel Sibley & Sajovec, PA

(57) ABSTRACT

An electronic apparatus includes a main board, a semiconductor package, an upper conductive EMI shield member, and a lower conductive EMI shield member. The main board includes a first ground pad. The semiconductor package is spaced apart from and electrically connected to the main board. The upper conductive EMI shield member covers a top surface and a sidewall of the semiconductor package. The lower conductive EMI shield member surrounds a space between the main board and the semiconductor package, and is electrically connected to the upper conductive EMI shield member and the first ground pad.

17 Claims, 13 Drawing Sheets

(56) References Cited

U.S. PATENT DOCUMENTS

2006/0091509 A1* 5/2006 Zhao et al. .................... 257/678
2007/0108583 A1* 5/2007 Shim et al. .................... 257/686
2009/0284947 A1 11/2009 Beddingfield et al.
2010/0127377 A1* 5/2010 Bauer et al. ................... 257/690
2011/0176279 A1 7/2011 Zhao et al.

FOREIGN PATENT DOCUMENTS

| | | |
|---|---|---|
| KR | 1020020003610 | 1/2002 |
| KR | 1020040060536 | 7/2004 |
| KR | 1020050100919 | 10/2005 |
| KR | 1020090026612 | 3/2009 |

* cited by examiner

ELECTRONIC DEVICES INCLUDING EMI SHIELD STRUCTURES FOR SEMICONDUCTOR PACKAGES AND METHODS OF FABRICATING THE SAME

CROSS-REFERENCE TO RELATED APPLICATION

This application claims priority under 35 USC §119 to Korean Patent Application No. 10-2012-0089892, filed on Aug. 17, 2012 in the Korean Intellectual Property Office (KIPO), the contents of which are herein incorporated by reference in their entirety.

FIELD

Example embodiments relate to an electronic apparatus and a method of manufacturing the same. More particularly, example embodiments relate to an electronic apparatus having a semiconductor package and a method of manufacturing the same.

BACKGROUND

Electromagnetic waves emitted from a semiconductor package can cause interference in adjacent semiconductor devices, which may generate noise and/or cause malfunction. In order to reduce or prevent the emission of electromagnetic waves, an electromagnetic interference (EMI) shield may be installed.

However, some conventional EMI shielding may not completely shield the semiconductor package, and thus malfunction of adjacent semiconductor devices due to the emission of electromagnetic waves may not be sufficiently reduced.

SUMMARY

Example embodiments provide an electronic apparatus in which the emission of electromagnetic waves is efficiently shielded.

Example embodiments provide a method of manufacturing an electronic apparatus in which the emission of electromagnetic waves is efficiently shielded.

According to example embodiments, an electronic device includes a main board having a board ground pad and one or more signal pads, a semiconductor package electrically connected to the one or more signal pads on the main board by one or more connecting members that define a gap between the semiconductor package and the main board, and a conductive electromagnetic interference shield structure. The conductive electromagnetic interference shield structure includes a lower conductive shield member extending on the main board adjacent a base of the semiconductor package and along a perimeter of the gap therebetween.

In some embodiments, the lower conductive shield member may electrically contact the board ground pad.

In some embodiments, the one or more connecting members may be a plurality of conductive bumps providing respective electrical connections to the signal pads, and the lower conductive shield member may surround the conductive bumps in plan view.

In some embodiments, the lower conductive shield member may continuously extend along the perimeter of the gap to completely surround the conductive bumps.

In some embodiments, the lower conductive shield member may discontinuously extend along the perimeter of the gap to define a plurality of spaced apart lower conductive shield members surrounding the conductive bumps.

In some embodiments, the conductive electromagnetic interference shield structure may further include an upper conductive shield member on the semiconductor package and electrically contacting the lower conductive shield member. The upper conductive shield member may electrically contact at least one of the board ground pad, a ground pad of a substrate of the semiconductor package, and a ground pad of at least one semiconductor chip of the semiconductor package.

In some embodiments, the upper conductive shield member may extend through an opening in a mold layer on the semiconductor package to contact the ground pad of the topmost semiconductor chip of the semiconductor package.

According to example embodiments, there is provided an electronic apparatus including a main board, a semiconductor package, an upper conductive EMI shield member, and a lower conductive EMI shield member. The main board includes a first ground pad. The semiconductor package is spaced apart from and electrically connected to the main board. The upper conductive EMI shield member covers a top surface and a sidewall of the semiconductor package. The lower conductive EMI shield member surrounds a space between the main board and the semiconductor package, and is electrically connected to the upper conductive EMI shield member and the first ground pad.

In example embodiments, the semiconductor package and the main board may be electrically connected to each other by a plurality of conductive bumps in the space between the main board and the semiconductor package.

In example embodiments, the semiconductor package may include a package substrate electrically connected to the main board, at least one semiconductor chips mounted on the package substrate, and a molding member covering the at least one semiconductor chips and being formed on the package substrate.

In example embodiments, the package substrate may include a second ground pad, and the upper conductive EMI shield member may be electrically connected to the second ground pad.

In example embodiments, an uppermost semiconductor chip among the at least one semiconductor chips may include a fourth ground pad, and the second ground pad may be electrically connected to the fourth pad so that the upper conductive EMI shield member may be electrically connected to the fourth ground pad.

In example embodiments, an uppermost semiconductor chip among the at least one semiconductor chips may include a third ground pad, and the upper conductive EMI shield member may be electrically connected to the third ground pad.

In example embodiments, the upper conductive EMI shield member may cover the top surface and a portion of the sidewall of the semiconductor package.

In example embodiments, the lower conductive EMI shield member may cover a portion of an outer sidewall of the upper conductive EMI shield member.

In example embodiments, the lower conductive EMI shield member may cover a bottom surface of a sidewall of the upper conductive EMI shield member.

In example embodiments, the first ground pad may be formed at an upper portion of the main board, and a top surface of the first ground pad may be substantially coplanar with a top surface of the main board. The lower conductive EMI shield member may be formed on the top surface of the first ground pad.

In example embodiments, the first ground pad may be buried in the main board, and the lower conductive EMI shield member may penetrate through an upper portion of the main board and be formed on the first ground pad and the main board.

In example embodiments, the first ground pad may protrude from a top surface of the main board, and the lower conductive EMI shield member may cover a top surface of the first ground pad and be formed on the main board.

According to example embodiments, there is provided an electronic apparatus including a main board, a semiconductor package, and a conductive EMI shield structure. The main board includes a ground pad. The semiconductor package is electrically connected to the main board. The conductive EMI shield structure seals the semiconductor package and a space between the semiconductor package and the main board, and is electrically connected the ground pad.

In example embodiments, the conductive EMI shield structure includes an upper conductive EMI shield member covering a top surface and a sidewall of the semiconductor package, and a lower conductive EMI shield member surrounding the space between the semiconductor package and the main board.

According to example embodiments, there is provided a method of manufacturing an electronic apparatus. In the method, an upper conductive EMI shield member is formed to cover a top surface and a sidewall of a semiconductor package. The semiconductor package is mounted on a main board including a ground pad so that the semiconductor package is spaced apart from the main board and is electrically connected to the main board. A lower conductive EMI shield member is formed on the main board to surround a space between the main board and the semiconductor package, and is electrically connected to the upper conductive EMI shield member and the first ground pad.

According to example embodiments, the electronic apparatus may include the first semiconductor package and the first EMI shield structure substantially sealing the first semiconductor package and the space between the main board and the semiconductor package, and thus may sufficiently shield electromagnetic waves emitted from the first semiconductor package. Additionally, the first EMI shield structure may be electrically connected to the first ground pad of the main board and the second ground pad of the first package substrate to be grounded, thereby having an enhanced EMI shielding effect.

BRIEF DESCRIPTION OF THE DRAWINGS

Example embodiments will be more clearly understood from the following detailed description taken in conjunction with the accompanying drawings.

FIG. 1 is a cross-sectional view illustrating an electronic apparatus including a semiconductor package in accordance with example embodiments, and FIG. 2 is a plan view illustrating the electronic apparatus of FIG. 1;

FIGS. 3 to 6 are cross-sectional views illustrating methods of manufacturing an electronic apparatus including a semiconductor package in accordance with example embodiments;

FIG. 7 is a plan view illustrating an electronic apparatus including a semiconductor package in accordance with example embodiments;

FIG. 8 is a cross-sectional view illustrating an electronic apparatus including a semiconductor package in accordance with example embodiments;

FIGS. 9 to 11 are cross-sectional views illustrating methods of manufacturing an electronic apparatus including a semiconductor package in accordance with example embodiments;

FIG. 12 is a cross-sectional view illustrating an electronic apparatus including a semiconductor package in accordance with example embodiments;

FIG. 13 is a cross-sectional view illustrating an electronic apparatus including a semiconductor package in accordance with example embodiments;

FIG. 14 is a cross-sectional view illustrating an electronic apparatus including a semiconductor package in accordance with example embodiments;

FIG. 15 is a cross-sectional view illustrating an electronic apparatus including a semiconductor package in accordance with example embodiments;

FIG. 16 is a cross-sectional view illustrating methods of manufacturing an electronic apparatus including a semiconductor package in accordance with example embodiments;

FIG. 17 is a cross-sectional view illustrating an electronic apparatus including a semiconductor package in accordance with example embodiments;

FIG. 18 is a cross-sectional view illustrating an electronic apparatus including a semiconductor package in accordance with example embodiments;

FIG. 19 is a cross-sectional view illustrating an electronic apparatus including a semiconductor package in accordance with example embodiments;

FIGS. 20 to 21 are cross-sectional views illustrating methods of manufacturing an electronic apparatus including a semiconductor package in accordance with example embodiments; and FIG. 22 is a cross-sectional view illustrating an electronic apparatus including a semiconductor package in accordance with example embodiments.

DETAILED DESCRIPTION OF EMBODIMENTS

Figure 1:
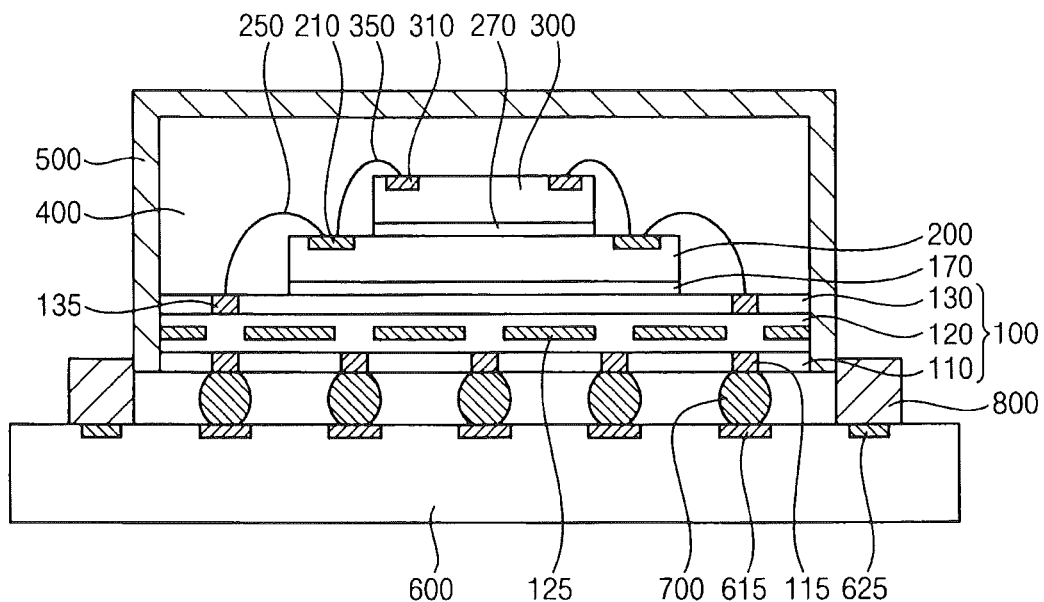
FIGS. 1 to 22 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
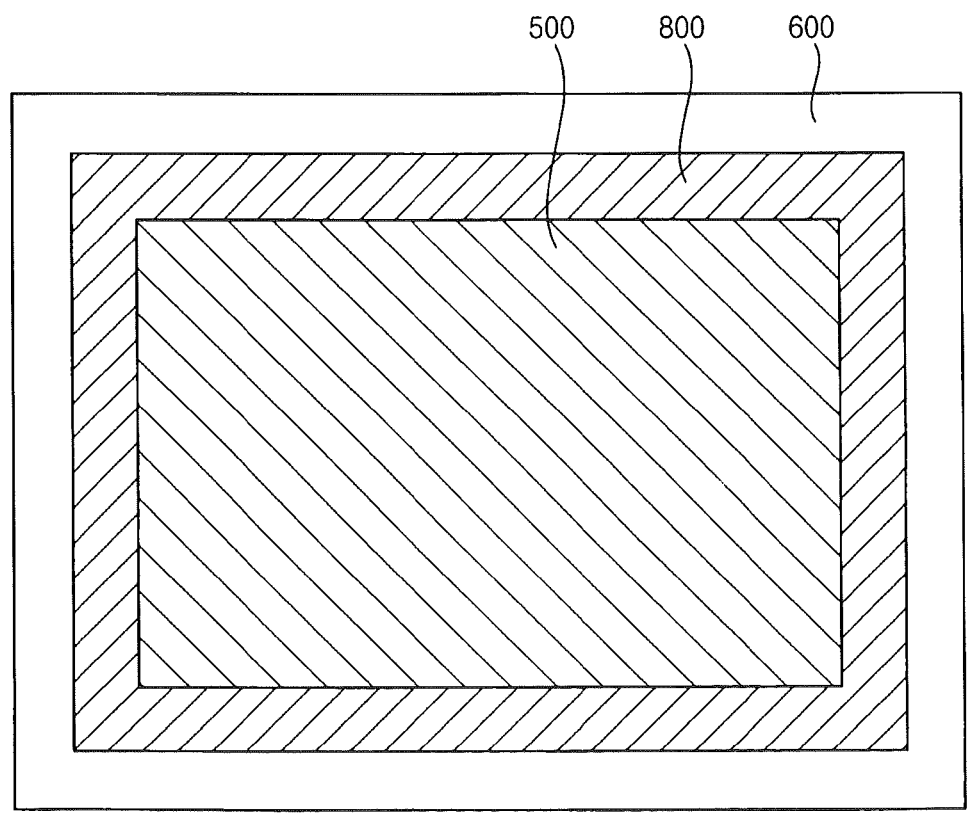

FIG. 1 is a cross-sectional view illustrating an electronic apparatus including a semiconductor package in accordance with example embodiments, and FIG. 2 is a plan view illustrating the electronic apparatus of FIG. 1.

Referring to FIGS. 1 and 2, the electronic apparatus includes a main board 600, a first semiconductor package and a first electromagnetic interference (EMI) shield structure.

The main board 600 may be, e.g., a printed circuit board (PCB). Various types of semiconductor packages, chips and electronic devices may be mounted on the main board 600.

The main board 600 may include a first signal pad 615 and a first ground pad 625 (also referred to herein as a board signal pad 615 and a board ground pad 625).

In example embodiments, a plurality of first signal pads 615 may be formed at upper portions of the main board 600, and top surfaces of the first signal pads 615 may be substantially coplanar with a top surface of the main board 600. Each first signal pad 615 may be electrically connected to circuit wirings on the main board 600.

In example embodiments, the first ground pad 625 may be formed at an upper portion of the main board 600, and a top surface of the ground pad 625 may be substantially coplanar with the top surface of the main board 600. The first ground pad 625 may be electrically connected to an additional ground circuit in the main board 600.

In an example embodiment, the first ground pad 625 may have a closed loop shape or a ring shape when viewed from a top side. For example, the first ground pad 625 may have a polygonal, e.g., rectangular ring shape or a circular ring shape when viewed from a top side. However, the shape of the first ground pad 625 may not be limited thereto, and may have, for example, a bar shape extending in a direction.

The first semiconductor package may be spaced apart from the main board 600, and may be electrically connected to the main board 600 via at least one connecting member 700. In example embodiments, the connecting member 700 may include a plurality of conductive bumps, e.g., solder balls adhered to the first signal pads 615, respectively.

In FIGS. 1 and 2, only one semiconductor package is shown, however, a plurality of semiconductor packages may be also mounted on the main board 600.

In example embodiments, the first semiconductor package may include a first package substrate 100 electrically connected to the main board 600, one or more semiconductor chips 200 and 300 mounted on the first package substrate 100, and a molding member 400 on or covering the semiconductor chips 200 and 300 and being formed on the first package substrate 100.

The first package substrate 100 may be, e.g., a PCB. In an example embodiment, the first package substrate 100 may include first, second and third layers 110, 120 and 130 sequentially stacked.

A plurality of second signal pads (or package signal pads) 115 may be formed in the first layer 110, and bottom surfaces of the second signal pads 115 may be substantially coplanar with a bottom surface of the first layer 110. The second signal pads 115 may be electrically connected to the first signal pads 615, respectively, of the main board 600 via the connecting member 700. The connecting member 700 may occupy a space between the first layer 110 and the main board 600, and thus the bottom surface of the first semiconductor package may not completely covered by the connecting member 700 but some portions thereof may be exposed.

The second signal pads 115 may be electrically connected to circuit wirings in the first layer 110.

A second ground pad (or package ground pad) 125 may be formed in the second layer 120. In an example embodiment, the second ground pad 125 may be buried in the second layer 120, and one or a plurality of second ground pads 125 may be formed. At least one outer wall of the plurality of second ground pads 125 may be exposed, for example, at an edge of the first package substrate 100.

One or more third signal pads 135 may be formed in the third layer 130, and top surfaces of the third signal pads 135 may be substantially coplanar with a top surface of the third layer 130. The third signal pads 135 may be electrically connected to circuit wirings in the third layer 130.

The first semiconductor chip 200 may be mounted on the first package substrate 100, and may be adhered to the first package substrate 100 via a first adhesion member 170. In an example embodiment, the first adhesion member 170 may include an adhesive film or an adhesive sheet on a bottom surface of the first semiconductor chip 200.

The first semiconductor chip 200 may include one or more fourth signal pads 210 at upper portions thereof. In example embodiments, the fourth signal pads 210 may be electrically connected to the third signal pads 135 at upper portions of the first package substrate 100 via a first conductive wiring 250.

Alternatively, the first adhesion member 170 may include conductive bumps on a bottom surface of the first semiconductor chip 200, and in this case, the fourth signal pads 210 at the upper portions of the first semiconductor chip 200 may be electrically connected to the third signal pads 135 at the upper portions of the first package substrate 100 by via electrodes extending through the first semiconductor chip 200 and the conductive bumps instead of the first conductive wiring 250.

The second semiconductor chip 300 may be stacked on the first semiconductor chip 200, and may be adhered to the first semiconductor chip 200 via a second adhesion member 270. In an example embodiment, the second adhesion member 270 may include an adhesive film or an adhesive sheet on or covering a bottom surface of the second semiconductor chip 300. Alternatively, the second adhesion member 270 may include one or more conductive bumps on the bottom surface of the second semiconductor chip 300.

The second semiconductor chip 300 may include one or more fifth signal pads 310 at upper portions thereof. In example embodiments, the fifth signal pads 310 may be electrically connected to the fourth signal pads 210, respectively, in the first semiconductor chip 200 via a second conductive wiring 350. Alternatively, the fifth signal pads 310 may be electrically connected to the third signal pads 135, respectively, in the first package substrate 100 via a third conductive wiring.

In FIGS. 1 and 2, two semiconductor chips 200 and 300 are mounted on the first package substrate 100; however, one or more than two semiconductor chips may be mounted on the first package substrate 100 in some embodiments.

The molding member 400 may be formed on the first package substrate 100 to seal and protect the first and second semiconductor chips 200 and 300. The molding member 400 may include, e.g., epoxy molding compound (EMC).

The first EMI shield structure may shield the first semiconductor package and the space between the first semiconductor package and the main board 600, and may be electrically connected to the first ground pad 625 in the main board 600.

In example embodiments, the first EMI shield structure may include a first upper EMI shield member 500 and a first lower EMI shield member 800.

The first upper EMI shield member 500 may cover a top surface and a sidewall of the first semiconductor package. That is, the first upper EMI shield member 500 may cover a top surface and a sidewall of the molding member 400 and a sidewall of the first package substrate 100. The exposed outer wall of the second ground pad 125 in the second layer 120 of the first package substrate 100 may contact the first upper EMI shield member 500 to be electrically connected thereto.

The first lower EMI shield member 800 may extend along a perimeter of the first semiconductor package adjacent a base thereof and/or surround a space or gap between the first semiconductor package and the main board 600, and thus electromagnetic waves emitting from a bottom surface of the first semiconductor package may be shielded by the first lower EMI shield member 800, thereby reducing and/or preventing outward propagation of the electromagnetic waves.

The first lower EMI shield member 800 may cover a lower portion of an outer wall of the first upper EMI shield member 500, and thus may be electrically connected thereto. That is, the first lower EMI shield member 800 may partially overlap with the first upper EMI shield member 500 in a horizontal direction. Additionally, the first lower EMI shield member 800 may contact a top surface of the first ground pad 625 in the main board 600, and thus may be electrically connected thereto.

In example embodiments, the first upper and lower EMI shield members 500 and 800 may include a conductive material. For example, the conductive material may include a metal such as copper, silver, etc.

The electronic apparatus may include the first semiconductor package and the first EMI shield structure substantially sealing the space between the first semiconductor package and the main board 600, and thus may sufficiently shield electromagnetic waves emitting from the first semiconductor package. Additionally, the first EMI shield structure may be electrically connected to the first ground pad 625 of the main board 600 and the second ground pad 125 of the first package substrate 100 so that the effect of shielding the electromagnetic waves may be enhanced.

FIGS. 3 to 6 are cross-sectional views illustrating methods of manufacturing an electronic apparatus including a semiconductor package in accordance with example embodiments. The method of manufacturing the electronic apparatus may be used in manufacturing the electronic apparatus of FIGS. 1 and 2, however, may not be limited thereto.

Figure 3:
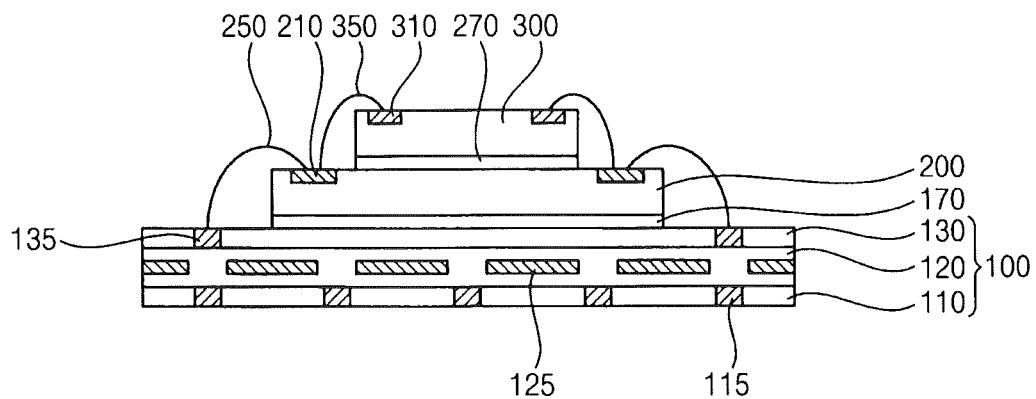

Referring to FIG. 3, first and second semiconductor chips 200 and 300 may be sequentially stacked on a first package substrate 100.

The first package substrate 100 may be, for example, a PCB. In an example embodiment, the first package substrate 100 may include first, second and third layers 110, 120 and 130 sequentially stacked.

A plurality of second signal pads 115 may be formed in the first layer 110, and a second ground pad 125 may be formed in the second layer 120. In an example embodiment, the second ground pad 125 may be buried in the second layer 120, and one or a plurality of second ground pads 125 may be formed. At least one outer wall of the second ground pads 125 may be exposed. One or more third signal pads 135 may be formed in the third layer 130.

The first and second semiconductor chips 200 and 300 may be adhered to the first package substrate 100 and the first semiconductor chip 200 via first and second adhesion members 170 and 270, respectively. In an example embodiment, the first and second adhesion members 170 and 270 may include an adhesive film or an adhesive sheet. Alternatively, the first and second adhesion members 170 and 270 may include one or more conductive bumps.

Additionally, a first conductive wiring 250 may be formed to electrically connect a fourth signal pad 210 at an upper portion of the first semiconductor chip 200 and a third signal pad 135 at an upper portion of the first package substrate 100, and a second conductive wiring 350 may be formed to electrically connect a fifth signal pad 310 at an upper portion of the second semiconductor chip 300 and the fourth signal pad 210 at the upper portion of the first semiconductor chip 200.

Figure 4:
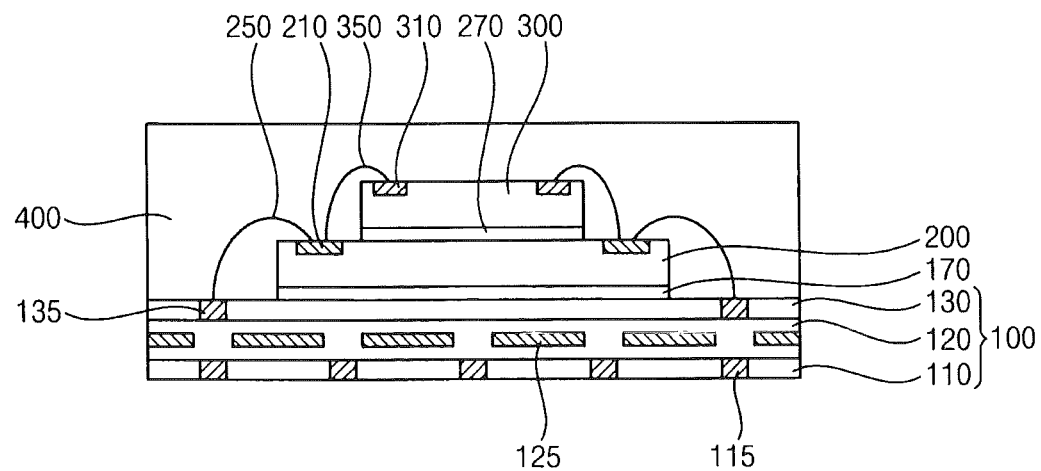

Referring to FIG. 4, a molding member 400 may be formed on the first package substrate 100 to cover the first and second semiconductor chips 200 and 300 and the first and second conductive wirings 250 and 350.

The molding member 400 may include, e.g., EMC.

Figure 5:
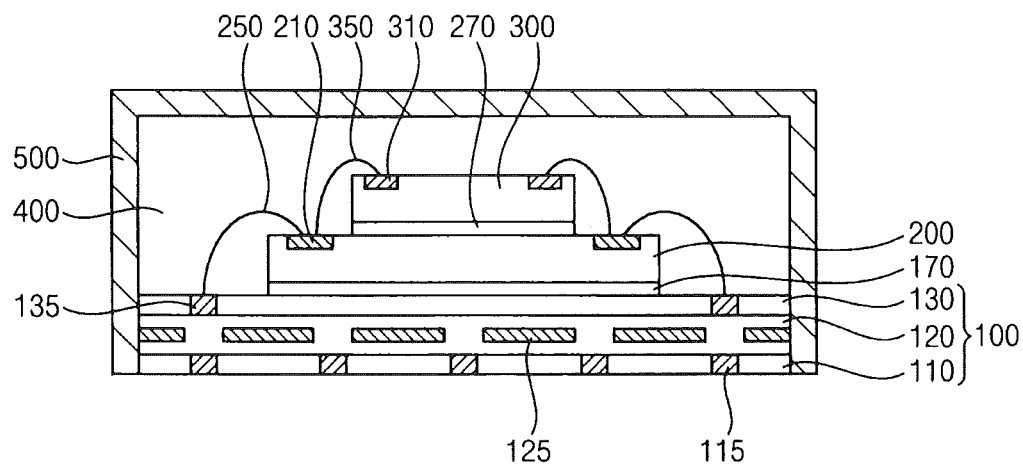

Referring to FIG. 5, a first upper EMI shield member 500 on or covering a top surface and a sidewall of the molding member 400 and a sidewall of the first package substrate 100 may be formed.

In example embodiments, the first upper EMI shield member 500 may be formed using a metal such as copper, silver, etc., by one or more of a coating process, a spraying process, an electroplating process, a deposition process, and the like.

Figure 6:
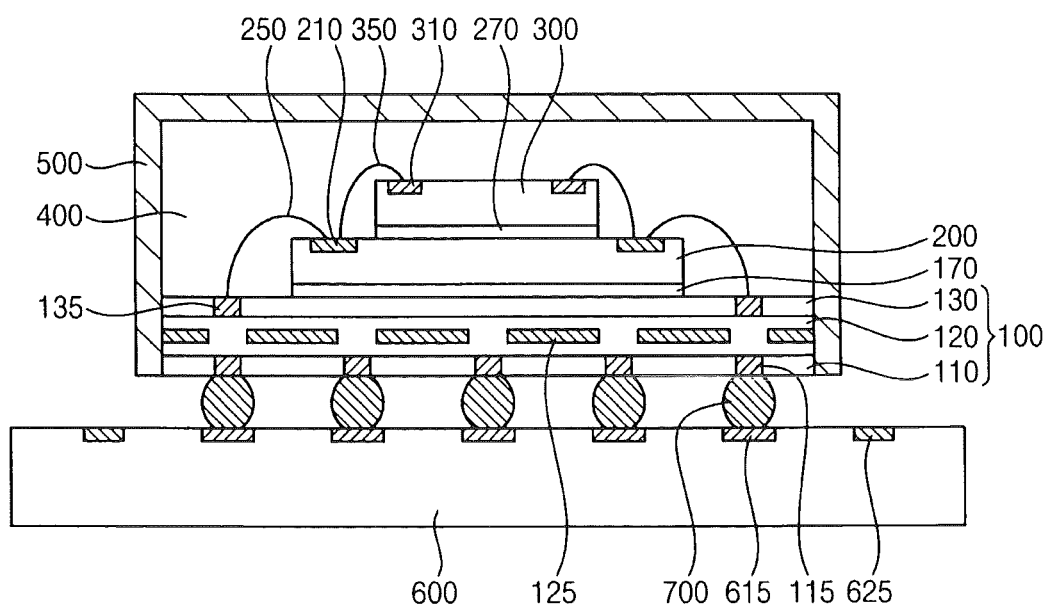

Referring to FIG. 6, at least one connecting member 700 may be formed between a top surface of the main board 600 and a bottom surface of the first package substrate 100 to attach each other and provide an electrical connection therebetween. The connecting member(s) may have a size or dimension sufficient to define a gap or space between the top surface of the main board 600 and the bottom surface of the first package substrate 100.

In example embodiments, conductive bumps such as solder balls may be formed between first signal pads 615 at upper portions of the main board 600 and the second signal pads 115 in the first layer 110 of the first package substrate 100 to attach the main board 600 and the first package substrate 100.

Referring again to FIGS. 1 and 2, a first lower EMI shield member 800 may be formed on the main board 600 to surround a space between the first package substrate 100 and the main board 600, thereby completing the electronic apparatus.

The first lower EMI shield member 800 may cover a lower portion of an outer wall of the first upper EMI shield member 500, and thus may be electrically connected thereto. Additionally, the first lower EMI shield member 800 may contact a top surface of a first ground pad 625 at an upper portion of the main board 600, and thus may be electrically connected thereto.

In example embodiments, the first lower EMI shield member 800 may be formed using a metal such as copper, silver, etc., by one or more of a coating process, a spraying process, an electroplating process, a deposition process, and the like.

Figure 7:
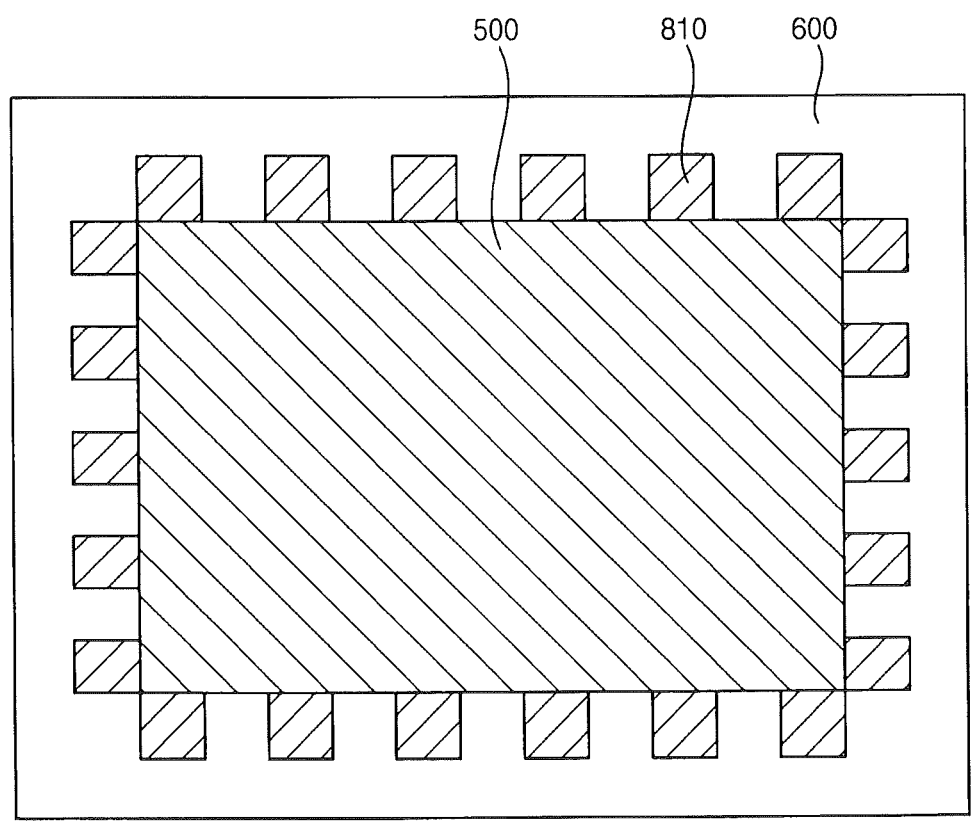

FIG. 7 is a plan view illustrating an electronic apparatus including a semiconductor package in accordance with example embodiments. The electronic apparatus may be substantially the same as that of FIGS. 1 and 2, except for the shape of the lower EMI shield member. Thus, like reference numerals refer to like elements, and detailed descriptions thereof are omitted.

Referring to FIG. 7, the electronic apparatus may include a main board 600, a first semiconductor package and a second EMI shield structure.

The second EMI shield structure may include a first upper EMI shield member 500 (refer to FIG. 1) and a second lower EMI shield member 810.

The second lower EMI shield member 810 may not continuously extend along a periphery of the gap between the first semiconductor package and the main board 600, and thus may not completely surround a space between the main board 600 and the first semiconductor package (in contrast to the first lower EMI shield member 800 of FIG. 2), but may instead include a plurality of EMI shields. That is, the second lower EMI shield member 810 may not continuously extend along the outer sidewall of the first upper EMI shield member 500, but a plurality of EMI shields spaced apart from each other may be disposed along the outer sidewall of the first upper EMI shield member 500.

The second EMI shield structure including the second lower EMI shield member 810 may have less effect of shielding electromagnetic waves when compared to the first EMI shield structure including the first lower EMI shield member 800; however, the first semiconductor package may be connected to electronic devices disposed on other regions of the main board 600 that are not under the first semiconductor package.

For convenience of explanation, hereinafter only the electronic apparatus including the EMI shield structure completely surrounding the space between the main board 600 and the semiconductor package like the first lower EMI shield member 800 will be discussed. However, it will be understood that the second lower EMI shield member 810 may instead be used in one or more embodiments described below.

Figure 8:
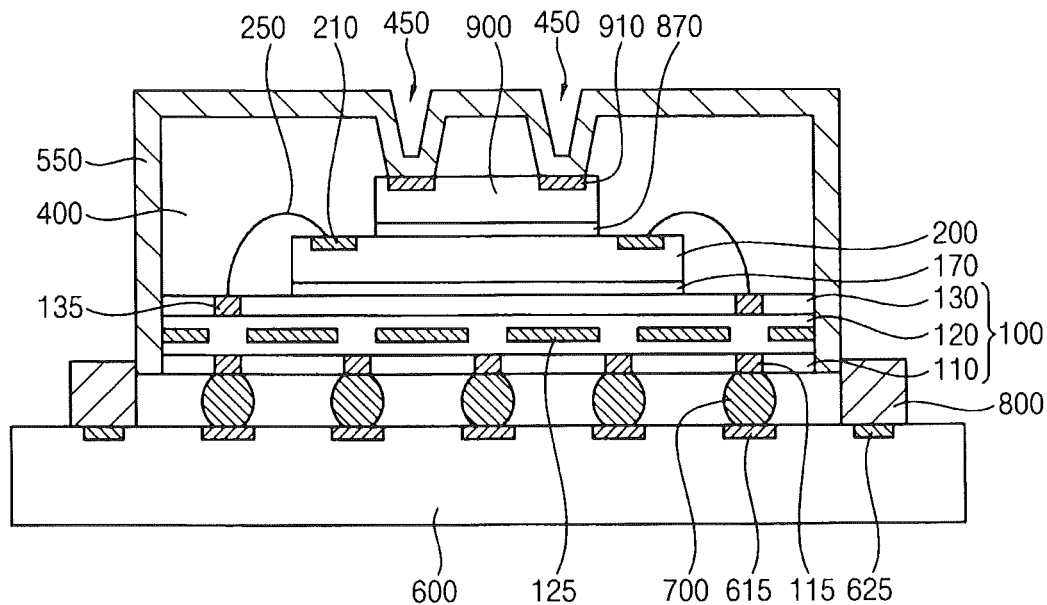

FIG. 8 is a cross-sectional view illustrating an electronic apparatus including a semiconductor package in accordance with example embodiments. The electronic apparatus may be substantially the same as that of FIGS. 1 and 2, except for the shapes of the semiconductor chip and/or the upper EMI shield member. Thus, like reference numerals refer to like elements, and detailed descriptions thereof are omitted.

Referring to FIG. 8, the electronic apparatus may include a main board 600, a second semiconductor package and a third EMI shield structure.

The second semiconductor package may include a first package substrate 100, a first semiconductor chip 200 and an interposer chip 900 sequentially stacked on the first package substrate 100, and a molding member 400 on or covering the first semiconductor chip 200 and the interposer chip 900 and being formed on the first package substrate 100.

The interposer chip 900 may be stacked on the first semiconductor chip 200, and may be adhered to the first semiconductor chip 200 via a third adhesion member 870. In an example embodiment, the third adhesion member 870 may include an adhesive film or an adhesive sheet on or covering a bottom surface of the interposer chip 900. Alternatively, the third adhesion member 870 may include one or more conductive bumps on the bottom surface of the interposer chip 900.

The interposer chip 900 may include one or more third ground pads 910 at an upper portion of thereof.

In FIG. 8, the interposer chip 900 is mounted on only one semiconductor chip; however, the interposer chip 900 may be mounted on a plurality of semiconductor chips in some embodiments.

An opening 450 exposing a top surface of each third ground pad 910 may be formed at an upper portion of the molding member 400.

The third EMI shield structure may include a second upper EMI shield member 550 and a first lower EMI shield member 800.

The second upper EMI shield member 550 may cover a top surface and a sidewall of the molding member 400 and a sidewall of the first package substrate 100, and also cover the top surfaces of the third ground pads 910 of the interposer chip 900 exposed by the opening 450. Thus, the third EMI shield structure including the second upper EMI shield member 550 and the first lower EMI shield member 800 may be electrically connected not only to the second ground pad 125 in the first package substrate 100 but also to the third ground pad 910 in the interposer chip 900. Additionally, the third EMI shield structure may be electrically connected to the first ground pad 625 in the main board 600. Thus, the effect of shielding electromagnetic waves may be enhanced.

Figure 9:
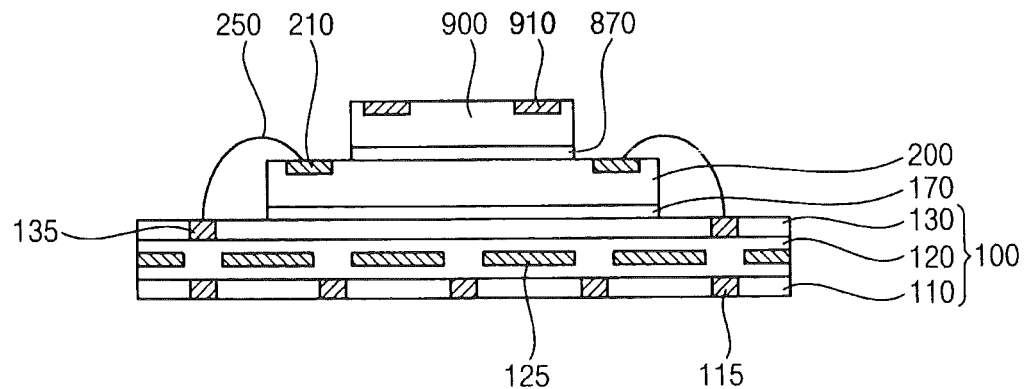
Figure 10:
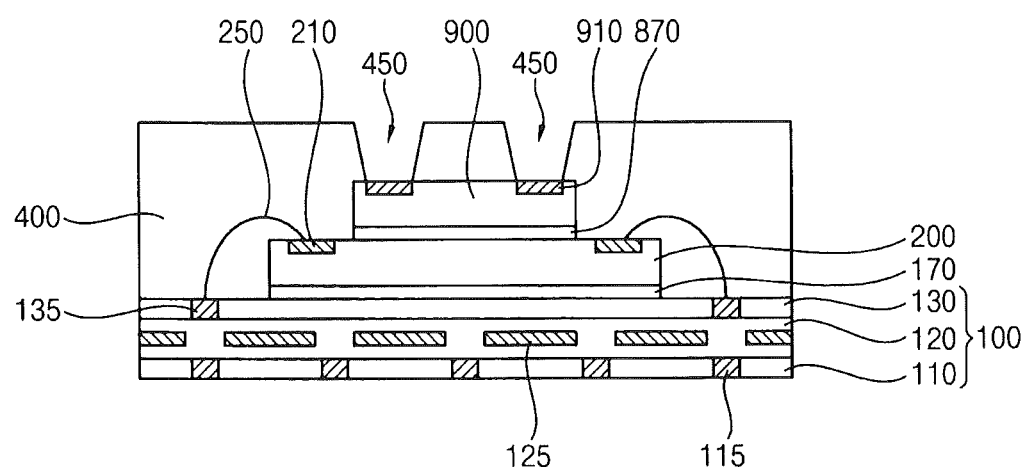
Figure 11:
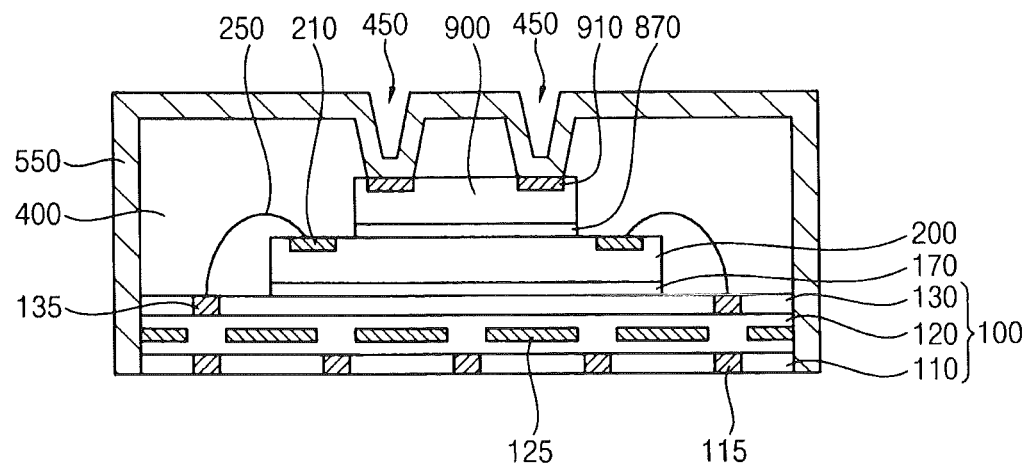

FIGS. 9 to 11 are cross-sectional views illustrating methods of manufacturing an electronic apparatus including a semiconductor package in accordance with example embodiments. The method of manufacturing the electronic apparatus may be used in manufacturing the electronic apparatus of FIG. 8, but may not be limited thereto. The method of manufacturing the electronic apparatus may include processes substantially the same as or similar to those illustrated with reference to FIGS. 3 to 6, and detailed descriptions thereof are omitted.

Referring to FIG. 9, a process substantially the same as or similar to those illustrated with reference to FIG. 3 may be performed. That is, a first semiconductor chip 200 and an interposer chip 900 may be sequentially stacked on a first package substrate 100.

The first semiconductor chip 200 may be adhered to the first package substrate 100 by a first adhesion member 170, and the interposer chip 900 may be adhered to the first semiconductor chip 200 by a third adhesion member 870. In an example embodiment, the first and/or third adhesion members 170 and 870 may include an adhesive film or an adhesive sheet. Alternatively, the first and/or third adhesion members 170 and 870 may include one or more conductive bumps.

Additionally, a first conductive wiring 250 connecting a fourth signal pad 210 at an upper portion of the first semiconductor chip 200 and a third signal pad 135 at an upper portion of the first package substrate 100 may be formed.

Referring to FIG. 10, a process substantially the same as or similar to those illustrated with reference to FIG. 4 may be performed to form a molding member 400 on or covering the first semiconductor chip 200, the interposer chip 900 and the first conductive wiring 250 on the first package substrate 100.

The molding member 400 may be partially removed to form an opening 450 to expose a top surface of a third ground pad 910 at an upper portion of the interposer chip 900.

Referring to FIG. 11, a process substantially the same as or similar to those illustrated with reference to FIG. 5 may be performed to form a second upper EMI shield member 550 on or covering a top surface and a sidewall of the molding member 400, a sidewall of the first package substrate 100 and the top surface of the third ground pad 910 exposed by the opening 450.

Referring to FIG. 8 again, processes substantially the same as or similar to those illustrated with reference to FIGS. 6 and 1 may be performed to form a connecting member 700 between a top surface of the main board 600 and a bottom surface of the first package substrate 100 so that they may be adhered to each other, and to form a first lower EMI shield member 800 surrounding a space between the first package substrate 100 and the main board 600 on the main board 600.

Figure 12:
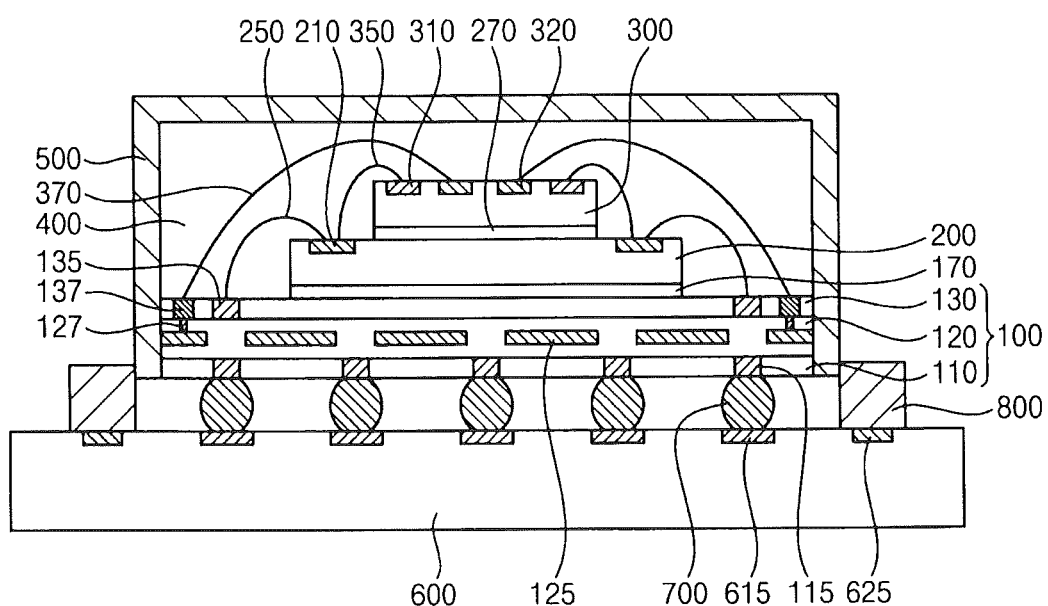

FIG. 12 is a cross-sectional view illustrating an electronic apparatus including a semiconductor package in accordance with example embodiments. The electronic apparatus may be substantially the same as that of FIGS. 1 and 2, except for constructions of the package substrate and the semiconductor chip and the conductive wiring. Thus, like reference numerals refer to like elements, and detailed descriptions thereof are omitted.

Referring to FIG. 12, the electronic apparatus may include a main board 600, a fourth semiconductor package and a first EMI shield structure.

The fourth semiconductor package may include a first package substrate 100, one or more semiconductor chips 200 and 300 mounted on the first package substrate 100, and a molding member 400 on or covering the semiconductor chips 200 and 300 and being formed on the first package substrate 100.

The first package substrate 100 may include first, second and third layers 110, 120 and 130 sequentially stacked.

A plurality of second signal pads 115 may be formed in the first layer 110, a second ground pad 125 may be formed in the second layer 120, and one or more third signal pads 135 may be formed in the third layer 130. Additionally, a first contact 127 making contact with the second ground pad 125 may be formed in the second layer 120, and a second contact 137 making contact with the first contact 127 may be formed in the third layer 130.

The first and second semiconductor chips 200 and 300 may be sequentially stacked on the first package substrate 100.

The first semiconductor chip 200 may include one or more fourth signal pads 210 at upper portions thereof, and the second semiconductor chip 300 may include one or more fifth signal pads 310 and one or more fourth ground pads 320 at upper portions thereof. In example embodiments, the fourth signal pads 210 may be electrically connected to the third signal pads 135, respectively, in the first package substrate 100 via a first conductive wiring 250, and the fifth signal pads 310 may be electrically connected to the fourth signal pads 210, respectively, in the semiconductor chip 300 via a second conductive wiring 350.

The fourth ground pads 320 may be electrically connected to the second contact 137 at an upper portion of the first package substrate 100 via a fourth conductive wiring 370, thereby being electrically connected to the second ground pad 125 via the first and second contacts 127 and 137.

The first EMI shield structure included in the electronic apparatus may be electrically connected to the first ground pad 625 of the main board 600 and the second ground pad 125 of the first package substrate 100. Additionally, according as the second ground pad 125 is electrically connected to the fourth ground pad 320 at the upper portion of the second semiconductor chip 300, the grounding of the first EMI shield structure may be enhanced, and thus the effect of shielding the electromagnetic waves may be enhanced.

Figure 13:
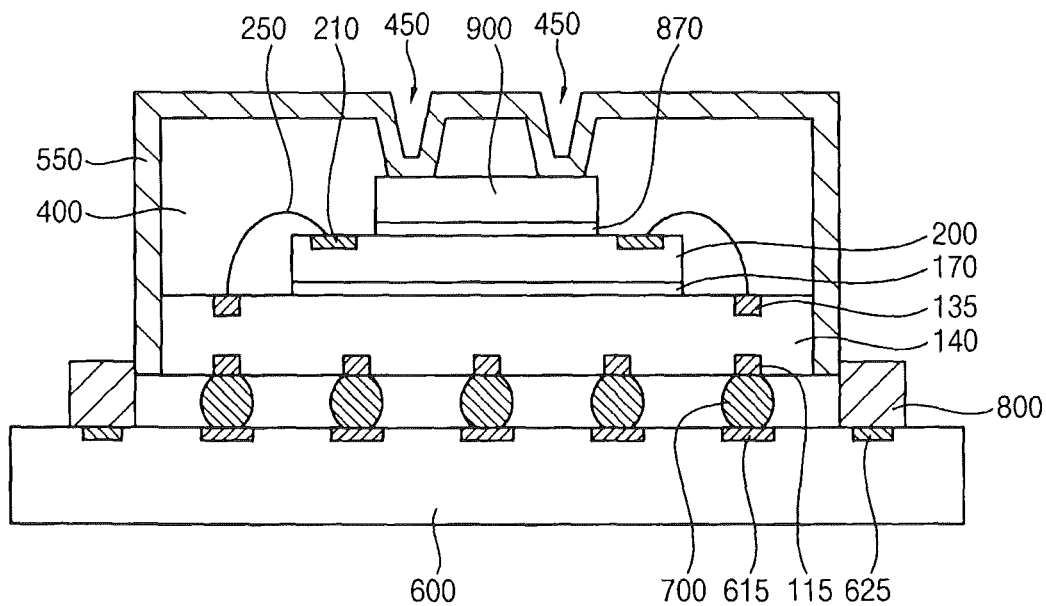

FIG. 13 is a cross-sectional view illustrating an electronic apparatus including a semiconductor package in accordance with example embodiments. The electronic apparatus may be substantially the same as that of FIG. 8, except for construction of the package substrate. Thus, like reference numerals refer to like elements, and detailed descriptions thereof are omitted.

Referring to FIG. 13, the electronic apparatus may include a main board 600, a fifth semiconductor package and a third EMI shield structure.

The fifth semiconductor package may include a second package substrate 140, a first semiconductor chip 200 and an interposer chip 900 sequentially stacked on the second package substrate 140, and a molding member 400 on or covering the first semiconductor chip 200 and the interposer chip 900 and being formed on the second package substrate 140.

The second package substrate 140 may not include the second ground pad 125 and the second layer 120 unlike the first package substrate 100. Thus, the second package substrate 140 may have a single layer structure or a double layer structure, and in FIG. 13, the second package substrate 140 having a single layered structure is shown. The second package substrate 140 may include a plurality of second signal pads 115 at lower portions thereof, and one or more third signal pads 135 at upper portions thereof. Additionally, the second and third signal pads 115 and 135 may be electrically connected to various types of circuit wirings in the second package substrate 140.

The interposer chip 900 may include a conductive material.

According as the second package substrate 140 does not include the second ground pad 125 (refer to FIG. 1), the third EMI shield structure may be electrically connected to the first ground pad 625 in the main board 600 and the interposer chip 900.

Figure 14:
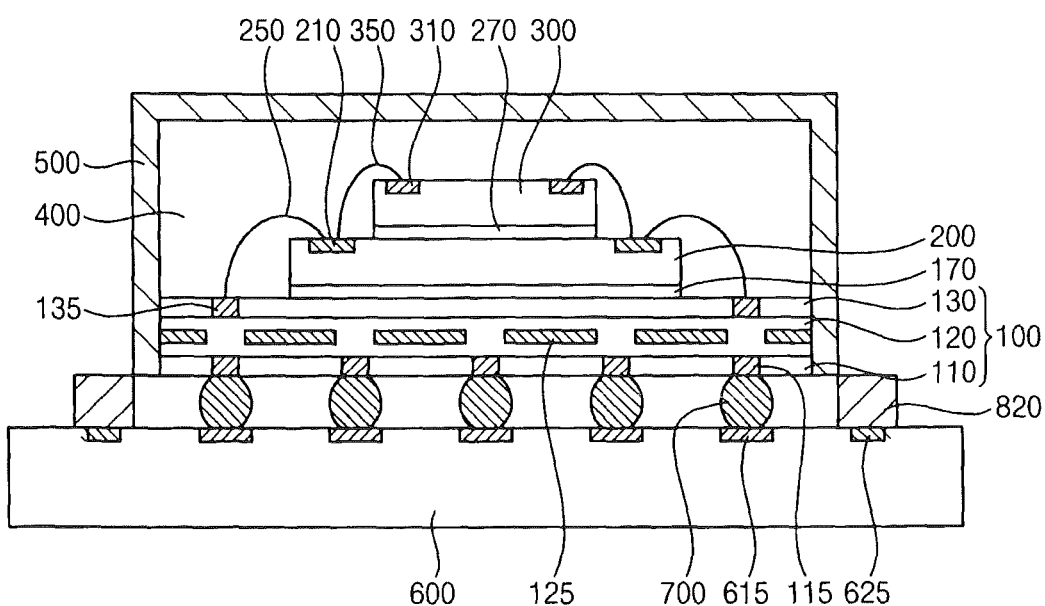

FIG. 14 is a cross-sectional view illustrating an electronic apparatus including a semiconductor package in accordance with example embodiments. The electronic apparatus may be substantially the same as that of FIGS. 1 and 2, except for the shape of the lower EMI shield member. Thus, like reference numerals refer to like elements, and detailed descriptions thereof are omitted.

Referring to FIG. 14, the electronic apparatus may include a main board 600, a first semiconductor package and a fourth EMI shield structure.

The fourth EMI shield structure may include a first upper EMI shield member 500 and a third lower EMI shield member 820.

The third lower EMI shield member 820 may extend along a perimeter and/or surround a space between the first semiconductor package and the main board 600. Unlike the first lower EMI shield member 800 (refer to FIG. 1), the third lower EMI shield member 820 may not cover an outer sidewall of the first upper EMI shield member 500. That is, the third lower EMI shield member 820 and the first upper EMI shield member 500 may not overlap with each other in a horizontal direction. Thus, a top surface of the third lower EMI shield member 820 may be substantially coplanar with a bottom surface of the first upper EMI shield member 500, and an edge of the top surface of the third lower EMI shield may contact an edge of the bottom surface of the first upper EMI shield member 500.

The fourth EMI shield structure including the third lower EMI shield member 820 may substantially seal the space between the first semiconductor package and the main board 600 like the first EMI shield structure, and may be electrically connected to the first and second ground pads 625 and 125 to be grounded.

Figure 15:
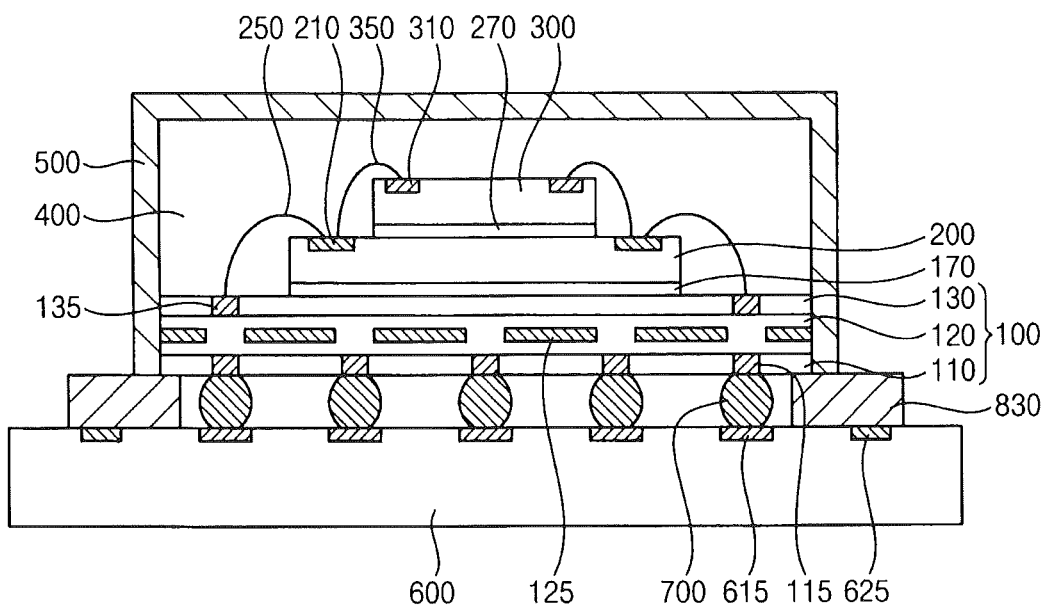

FIG. 15 is a cross-sectional view illustrating an electronic apparatus including a semiconductor package in accordance with example embodiments. The electronic apparatus may be substantially the same as that of FIGS. 1 and 2, except for the shape of the lower EMI shield member. Thus, like reference numerals refer to like elements, and detailed descriptions thereof are omitted.

Referring to FIG. 15, the electronic apparatus may include a main board 600, a first semiconductor package and a fifth EMI shield structure.

The fifth EMI shield structure may include a first upper EMI shield member 500 and a fourth lower EMI shield member 830.

The fourth lower EMI shield member 830 may extend along a perimeter and/or surround a space between the first semiconductor package and the main board 600. The fourth lower EMI shield member 830 may contact a bottom surface of a sidewall of the first upper EMI shield member 500. Thus, the fourth lower EMI shield member 830 may extend under or beneath the first upper EMI shield member 500, and may not partially overlap in a vertical direction. Additionally, the fourth lower EMI shield member 830 may extend on or cover a portion of a bottom surface of the first semiconductor package.

The fifth EMI shield structure including the fourth lower EMI shield member 830 may substantially seal the space between the first semiconductor package and the main board 600 like the first EMI shield structure including the first lower EMI shield member 800 (refer to FIG. 1), and may be electrically connected to the first and second ground pads 625 and 125 to be grounded.

Figure 16:
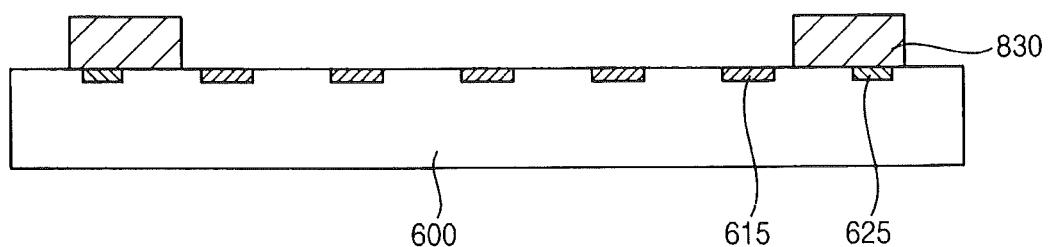

FIG. 16 is a cross-sectional view illustrating methods of manufacturing an electronic apparatus including a semiconductor package in accordance with example embodiments. The method of manufacturing the electronic apparatus may be used in manufacturing the electronic apparatus of FIG. 15, but may not be limited thereto. The method of manufacturing the electronic apparatus may include processes substantially the same as or similar to those illustrated with reference to FIGS. 3 to 6, and detailed descriptions thereof are omitted.

Referring to FIG. 16, a fourth lower EMI shield member 830 may be formed on a main board 600.

In example embodiments, the fourth lower EMI shield member 830 may be formed on a top surface of a first ground pad 625 at an upper portion of the main board 600, and may have a wide area within the degree in which the fourth lower EMI shield member 830 may not contact first signal pads 615. In example embodiments, the fourth lower EMI shield member 830 may be formed by at least one of a coating process, a spraying process, an electroplating process, a deposition process, etc.

Referring again to FIG. 15, processes substantially the same as or similar to those illustrated with reference to FIGS. 3 to 6 and FIG. 1 may be performed to form a first upper EMI shield member 500 on or covering a top surface and a sidewall of the first semiconductor package, and to adhere a bottom surface of the first semiconductor package and a top surface of the main board 600 to each other via a connecting member 700. A bottom surface of a sidewall of the first upper EMI shield member 500 may contact a top surface of the fourth lower EMI shield member 830, and thus a space between the bottom surface of the first semiconductor package and the top surface of the main board 600 may be surrounded by the fourth lower EMI shield member 830.

Figure 17:
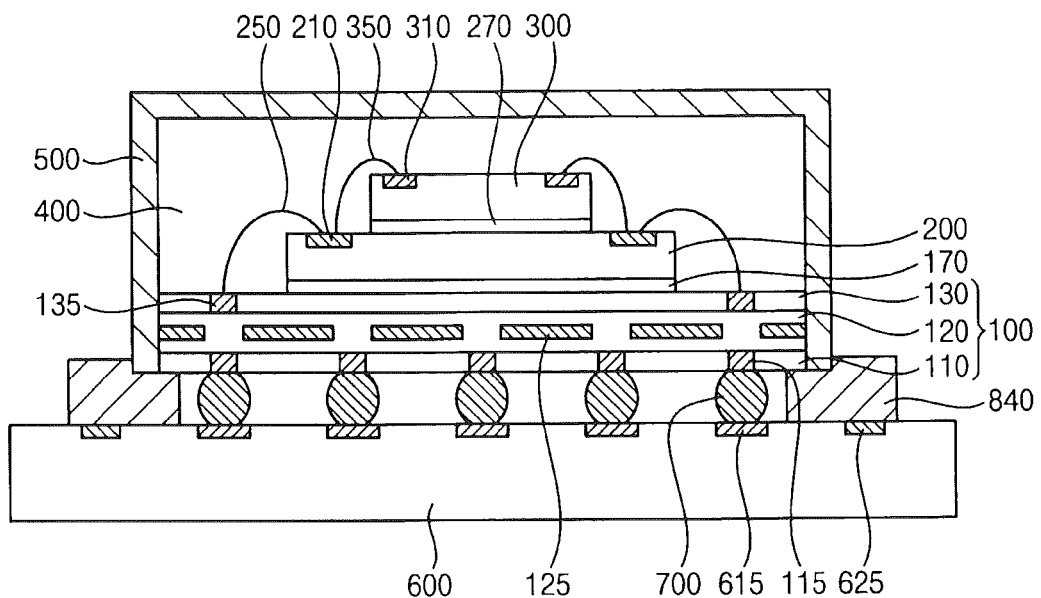

FIG. 17 is a cross-sectional view illustrating an electronic apparatus including a semiconductor package in accordance with example embodiments. The electronic apparatus may be substantially the same as that of FIGS. 1 and 2, except for the shape of the lower EMI shield member. Thus, like reference numerals refer to like elements, and detailed descriptions thereof are omitted.

Referring to FIG. 17, the electronic apparatus may include a main board 600, a first semiconductor package and a sixth EMI shield structure.

The sixth EMI shield structure may include a first upper EMI shield member 500 and a fifth lower EMI shield member 840.

The fifth lower EMI shield member 840 may extend along a perimeter and/or surround a space between the first semiconductor package and the main board 600. The fifth lower EMI shield member 840 may cover a portion of an outer sidewall and a bottom surface of a sidewall of the first upper EMI shield member 500. Thus, the fifth lower EMI shield member 840 and the first upper EMI shield member 500 may partially overlap in vertical and horizontal directions, respectively. Additionally, the fifth lower EMI shield member 840 may cover a portion of a bottom surface of the first semiconductor package.

The sixth EMI shield structure including the fifth lower EMI shield member 840 may substantially seal the space between the first semiconductor package and the main board 600 like the first EMI shield structure including the first lower EMI shield member 800 (refer to FIG. 1), and may be electrically connected to the first and second ground pads 625 and 125 to be grounded.

In some embodiments, the first upper EMI shield member 500 may cover only a portion of a sidewall of the first package substrate 100, e.g., only an upper portion of the sidewall of the first package substrate 100 so that the first upper EMI shield member 500 may not contact the second ground pad 125, and a lower portion of the sidewall of the first package substrate 100 may be exposed. Instead, the fifth lower EMI shield member 840 may cover the exposed lower portion of the sidewall of the first package substrate 100 to contact the second ground pad 125, thereby being grounded.

Figure 18:
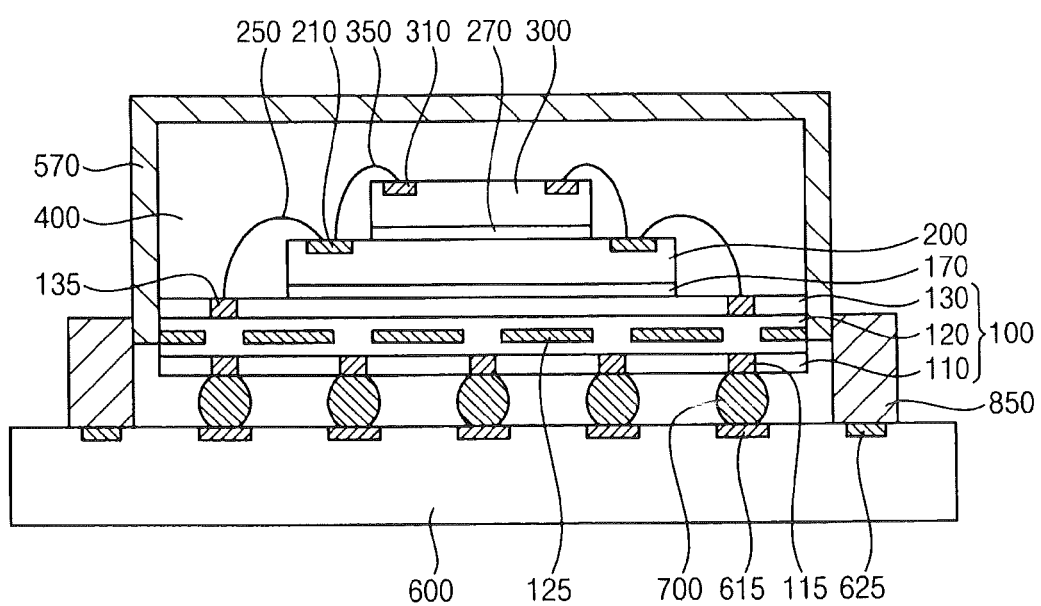

FIG. 18 is a cross-sectional view illustrating an electronic apparatus including a semiconductor package in accordance with example embodiments. The electronic apparatus may be substantially the same as that of FIGS. 1 and 2, except for the shape of the EMI shield structure. Thus, like reference numerals refer to like elements, and detailed descriptions thereof are omitted.

Referring to FIG. 18, the electronic apparatus may include a main board 600, a first semiconductor package and a seventh EMI shield structure.

The seventh EMI shield structure may include a third upper EMI shield member 570 and a sixth lower EMI shield member 850.

The third upper EMI shield 570 may cover a top surface and a portion of a sidewall of the first semiconductor package. Particularly, the third upper EMI shield member 570 may cover a top surface and a sidewall of the molding member 400, a sidewall of the third layer 130 of the first package substrate 100, and a portion of a sidewall of the second layer 120 of the first package substrate 100. The third upper EMI shield member 570 may contact the exposed outer sidewall of the second ground pads 125 in the second layer 120 to be electrically connected thereto.

The sixth lower EMI shield member 850 may extend along a perimeter and/or surround a space between the first semiconductor package and the main board 600. The sixth lower EMI shield member 850 may cover a portion of an outer sidewall of the third upper EMI shield member 570. Thus, the sixth lower EMI shield member 850 and the third upper EMI shield member 570 may partially overlap in a horizontal direction.

The seventh EMI shield structure including the third upper EMI shield member 570 and the sixth lower EMI shield member 850 may substantially seal the space between the first semiconductor package and the main board 600 like the first EMI shield structure including the first upper EMI shield member 500 (refer to FIG. 1) and the first lower EMI shield member 800 (refer to FIG. 1), and may be electrically connected to the first and second ground pads 625 and 125 to be grounded.

Figure 19:
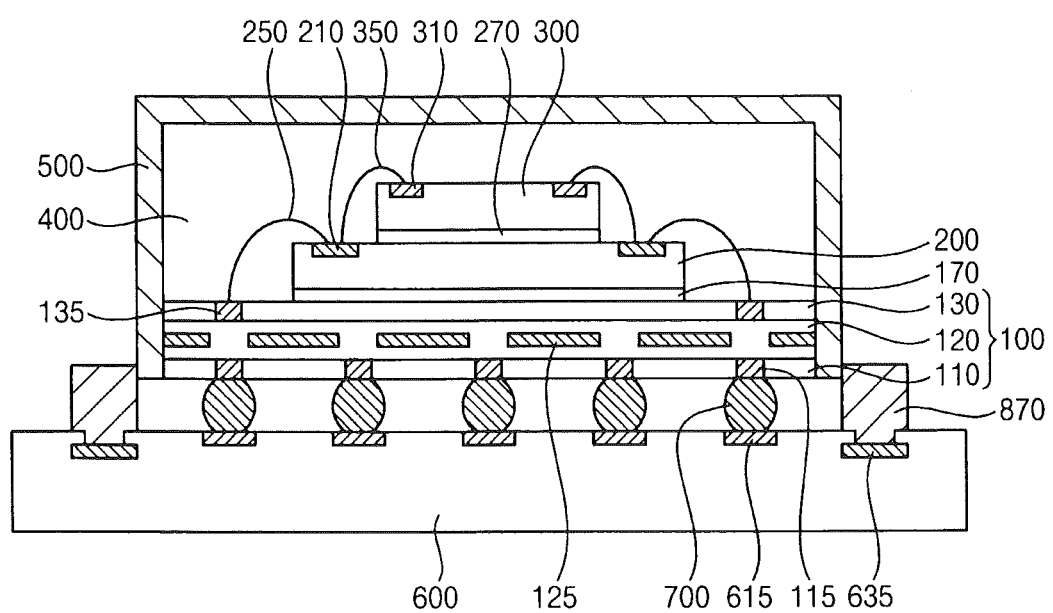

FIG. 19 is a cross-sectional view illustrating an electronic apparatus including a semiconductor package in accordance with example embodiments. The electronic apparatus may be substantially the same as that of FIGS. 1 and 2, except for the shape of the main board and the lower EMI shield member. Thus, like reference numerals refer to like elements, and detailed descriptions thereof are omitted.

Referring to FIG. 19, the electronic apparatus may include a main board 600, a first semiconductor package and a ninth EMI shield structure.

The main board 600 may include a first signal pad 615 and a fifth ground pad 635.

In example embodiments, a plurality of first signal pads 615 may be formed at upper portions of the main board 600, and top surfaces of the first signal pads 615 may be substantially coplanar with a top surface of the main board 600. In example embodiments, the fifth ground pad 635 may be buried in the main board 600, and thus a top surface of the fifth ground pad 635 may be lower than or otherwise not coplanar with the top surface of the main board 600.

The ninth EMI shield structure may include a first upper EMI shield member 500 and an eighth lower EMI shield member 870.

The eighth lower EMI shield member 870 may extend along a perimeter and/or surround a space between the first semiconductor package and the main board 600. The eighth lower EMI shield member 870 may cover a portion of an outer sidewall of the first upper EMI shield member 500. Additionally, the eighth lower EMI shield member 870 may extend into or penetrate through an upper portion of the main board 600 to contact the top surface of the fifth ground pad 635.

The ninth EMI shield structure including the first upper EMI shield member 500 and the eighth lower EMI shield member 870 may substantially seal the space between the first semiconductor package and the main board 600 like the first EMI shield structure including the first upper EMI shield member 500 (refer to FIG. 1) and the first lower EMI shield member 800 (refer to FIG. 1). Additionally, the ninth EMI shield structure may be electrically connected to the first and second ground pads 625 and 125 to be grounded.

Figure 20:
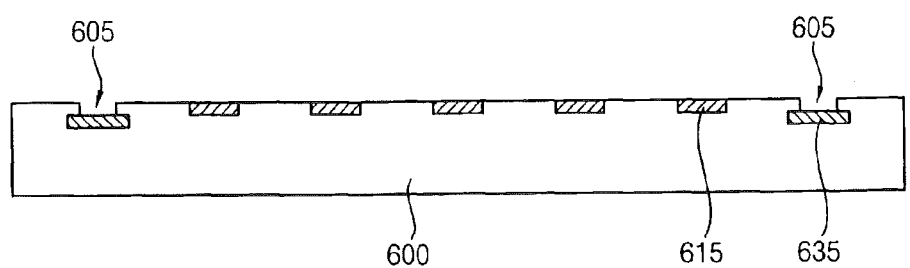
Figure 21:
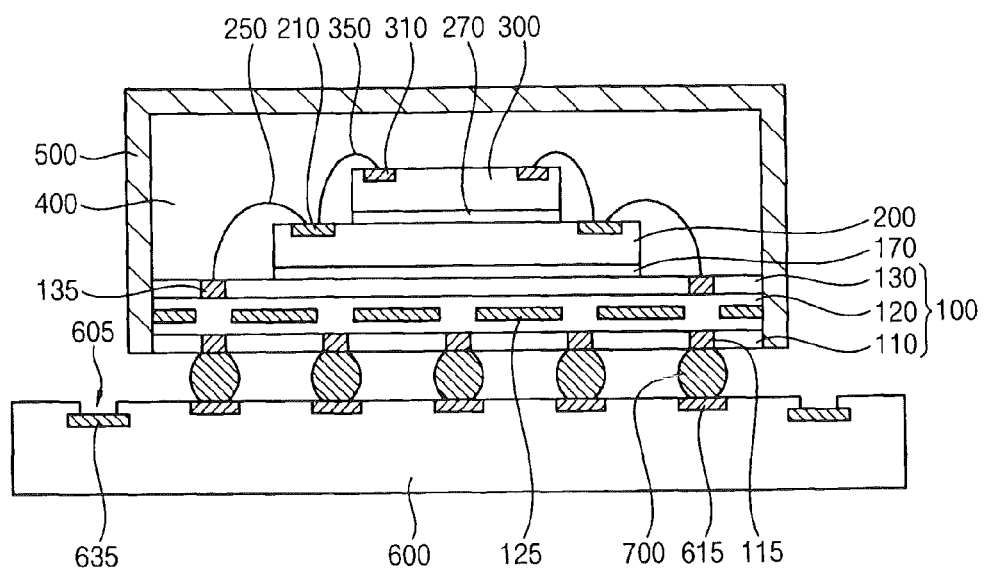

FIGS. 20 to 21 are cross-sectional views illustrating methods of manufacturing an electronic apparatus including a semiconductor package in accordance with example embodiments. The method of manufacturing the electronic apparatus may be used in manufacturing the electronic apparatus of FIG. 19, but may not be limited thereto. The method of manufacturing the electronic apparatus may include processes substantially the same as or similar to those illustrated with reference to FIGS. 3 to 6, and detailed descriptions thereof are omitted.

Referring to FIG. 20, a recess 605 may be formed at an upper portion of a main board 600 to expose a top surface of a fifth ground pad 635.

Referring to FIG. 21, processes substantially the same as or similar to those illustrated with reference to FIGS. 3 to 6 may be performed to form a first upper EMI shield member 500 on or covering a top surface and a sidewall of the first semiconductor package, and to adhere a bottom surface of the first semiconductor package and a top surface of the main board 600 to each other by a connecting member 700.

Referring to FIG. 19 again, an eighth EMI shield member 870 may be formed on the exposed fifth ground pad 635 and the main board 600 to sufficiently fill the recess 605. The eighth lower EMI shield member 870 may cover an outer sidewall of the first upper EMI shield member 500, and a space between a bottom surface of the first semiconductor package and a top surface of the main board 600 may be surrounded by the eighth lower EMI shield member 870.

Figure 22:
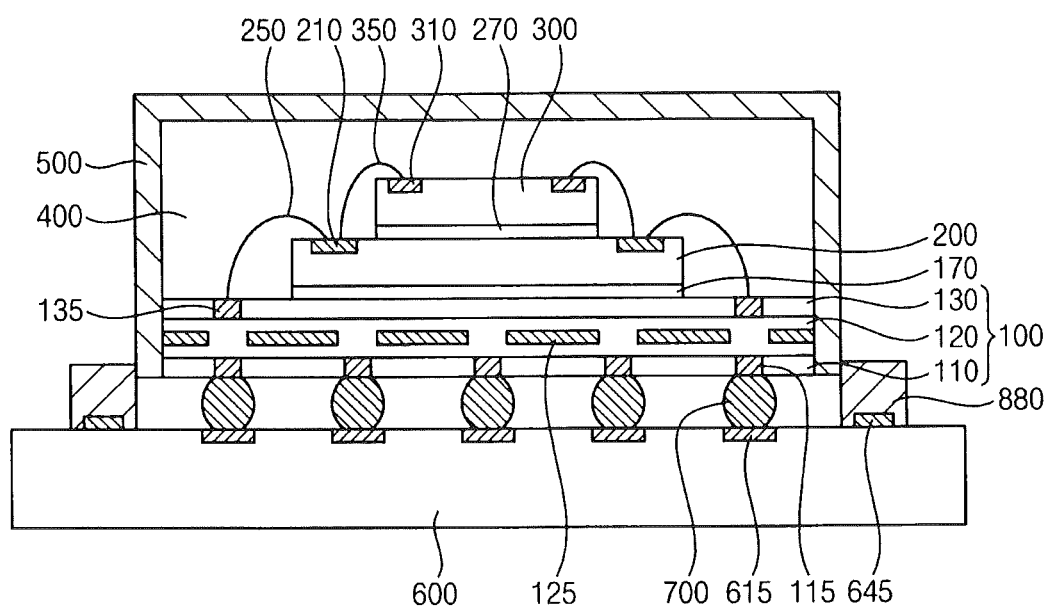

FIG. 22 is a cross-sectional view illustrating an electronic apparatus including a semiconductor package in accordance with example embodiments. The electronic apparatus may be substantially the same as that of FIGS. 1 and 2, except for the shape of the main board and the lower EMI shield member. Thus, like reference numerals refer to like elements, and detailed descriptions thereof are omitted.

Referring to FIG. 22, the electronic apparatus may include a main board 600, a first semiconductor package and a tenth EMI shield structure.

The main board 600 may include a first signal pad 615 and a sixth ground pad 645.

In example embodiments, a plurality of first signal pads 615 may be formed at upper portions of the main board 600, and top surfaces of the first signal pads 615 may be substantially coplanar with a top surface of the main board 600. In example embodiments, the sixth ground pad 645 may be formed on the main board 600, and thus a top surface of the sixth ground pad 645 may be higher than the top surface of the main board 600.

The tenth EMI shield structure may include a first upper EMI shield member 500 and a ninth lower EMI shield member 880.

The ninth lower EMI shield member 880 may extend along a perimeter and/or surround a space between the first semiconductor package and the main board 600. The ninth lower EMI shield member 880 may cover a portion of an outer sidewall of the first upper EMI shield member 500. Additionally, the ninth lower EMI shield member 880 may cover the sixth ground pad 645 and be formed on the main board 600.

The tenth EMI shield structure including the first upper EMI shield member 500 and the ninth lower EMI shield member 880 may substantially seal the space between the first semiconductor package and the main board 600 like the first EMI shield structure including the first upper EMI shield member 500 (refer to FIG. 1) and the first lower EMI shield member 800 (refer to FIG. 1). Additionally, the tenth EMI shield structure may be electrically connected to the first and second ground pads 625 and 125 to be grounded.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An electronic apparatus, comprising:
   a main board including a first ground pad;
   a semiconductor package spaced apart from and electrically connected to the main board;
   an upper conductive electromagnetic interference (EMI) shield member on a top surface and a sidewall of the semiconductor package; and
   a lower conductive EMI shield member on the main board and extending along a periphery of a space between the main board and the semiconductor package, the lower conductive EMI shield member being electrically connected to the upper conductive EMI shield member and the first ground pad,
   wherein a top surface of the first ground pad is substantially coplanar with a top surface of the main board,
   and wherein the lower conductive EMI shield member is formed on the top surface of the first ground pad.

2. The electronic apparatus of claim 1, wherein the semiconductor package and the main board are electrically connected to each other by a plurality of conductive bumps in the space between the main board and the semiconductor package.

3. The electronic apparatus of claim 1, wherein the semiconductor package includes:
   a package substrate electrically connected to the main board;
   at least one semiconductor chip mounted on the package substrate; and
   a molding member being on the package substrate and covering the at least one semiconductor chip.

4. The electronic apparatus of claim 3, wherein the package substrate includes a second ground pad, and wherein the upper conductive EMI shield member is electrically connected to the second ground pad.

5. The electronic apparatus of claim 4, wherein an uppermost semiconductor chip among the at least one semiconductor chip includes a fourth ground pad,
   and wherein the second ground pad is electrically connected to the fourth pad so that the upper conductive EMI shield member is electrically connected to the fourth ground pad.

6. The electronic apparatus of claim 3, wherein an uppermost semiconductor chip among the at least one semiconductor chips includes a third ground pad,
   and wherein the upper conductive EMI shield member extends through a portion of the molding member to electrically contact the third ground pad.

7. The electronic apparatus of claim 1, wherein the upper conductive EMI shield member covers the top surface and a portion of the sidewall of the semiconductor package.

8. The electronic apparatus of claim 1, wherein the lower conductive EMI shield member covers a portion of an outer sidewall of the upper conductive EMI shield member.

9. The electronic apparatus of claim 1, wherein the lower conductive EMI shield member covers a bottom surface of a sidewall of the upper conductive EMI shield member.

10. An electronic apparatus, comprising:
    a main board including a first ground pad;
    a semiconductor package spaced apart from and electrically connected to the main board;
    an upper conductive electromagnetic interference (EMI) shield member on a top surface and a sidewall of the semiconductor package; and
    a lower conductive EMI shield member on the main board and extending along a periphery of a space between the main board and the semiconductor package, the lower conductive EMI shield member being electrically connected to the upper conductive EMI shield member and the first ground pad,
    wherein the first ground pad is buried below a top surface of the main board,
    and wherein the lower conductive EMI shield member penetrates through the top surface of the main board and is formed on the first ground pad and the main board.

11. An electronic apparatus, comprising:
    a main board including a first ground pad;
    a semiconductor package spaced apart from and electrically connected to the main board;
    an upper conductive electromagnetic interference (EMI) shield member on a top surface and a sidewall of the semiconductor package; and
    a lower conductive EMI shield member on the main board and extending along a periphery of a space between the main board and the semiconductor package, the lower conductive EMI shield member being electrically connected to the upper conductive EMI shield member and the first ground pad, wherein the first ground pad protrudes from a top surface of the main board,
    and wherein the lower conductive EMI shield member covers a top surface and at least one sidewall of the first ground pad and is formed on the main board.

12. The device of claim 11, wherein:
    the main board includes one or more signal pads;
    the semiconductor package is electrically connected to the one or more signal pads on the main board by one or more connecting members that define a gap between the semiconductor package and the main board; and the lower conductive EMI shield member extends on the main board adjacent a base of the semiconductor package and along a perimeter of the gap therebetween.

13. The device of claim 12, wherein the one or more connecting members comprises a plurality of conductive bumps providing respective electrical connections to the signal pads, and wherein the lower conductive EMI shield member surrounds the conductive bumps in plan view.

14. The device of claim 13, wherein the lower conductive EMI shield member continuously extends along the perimeter of the gap to completely surround the conductive bumps.

15. The device of claim 13, wherein the lower conductive EMI shield member discontinuously extends along the perimeter of the gap to define a plurality of spaced apart lower conductive shield members surrounding the conductive bumps.

16. The device of claim 12,
wherein the upper conductive EMI shield member electrically contacts at least one of the first ground pad, a ground pad of a substrate of the semiconductor package, and a ground pad of at least one semiconductor chip of the semiconductor package.

17. The device of claim 16, wherein the upper conductive EMI shield member extends through an opening in a mold layer on the semiconductor package to contact the ground pad of the topmost semiconductor chip of the semiconductor package.

* * * * *